(12) United States Patent
Nishiguchi

(10) Patent No.: US 11,824,112 B2
(45) Date of Patent: *Nov. 21, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Toshifumi Nishiguchi, Hakusan Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/865,246

(22) Filed: Jul. 14, 2022

(65) Prior Publication Data

US 2022/0352367 A1    Nov. 3, 2022

Related U.S. Application Data

(63) Continuation of application No. 17/005,694, filed on Aug. 28, 2020, now Pat. No. 11,430,884.

(30) Foreign Application Priority Data

Dec. 26, 2019  (JP) ................................ 2019-235773

(51) Int. Cl.
*H01L 29/78*     (2006.01)
*H01L 29/423*    (2006.01)
(Continued)

(52) U.S. Cl.
CPC ...... *H01L 29/7813* (2013.01); *H01L 29/0649* (2013.01); *H01L 29/407* (2013.01);
(Continued)

(58) Field of Classification Search
CPC ............ H01L 29/407; H01L 29/66734; H01L 29/7813; H01L 29/66348; H01L 29/7897; H01L 29/4236; H01L 29/42376
See application file for complete search history.

(56) References Cited

U.S. PATENT DOCUMENTS

2007/0126056 A1   6/2007  Hirler
2008/0179670 A1   7/2008  Wilmeroth et al.
(Continued)

FOREIGN PATENT DOCUMENTS

JP    2008-270606 A    11/2008
JP    2013-65774 A     4/2013
(Continued)

*Primary Examiner* — Yu Chen
(74) *Attorney, Agent, or Firm* — Allen & Overy LLP

(57) ABSTRACT

A semiconductor device includes a semiconductor part; first and second electrodes respectively on back and front surfaces of the semiconductor part; third and fourth electrodes inside a trench of the semiconductor part, the fourth electrode being provided between the first electrode and the third electrode; a first insulating portion electrically insulating the third electrode from the semiconductor part; a second insulating portion electrically insulating the third electrode from the second electrode; a third insulating portion electrically insulating the fourth electrode from the semiconductor part; a fourth insulating portion electrically insulating the fourth electrode from the third electrode; and a fifth insulating portion including a first portion and a second portion, the first portion being provided inside the fourth electrode, the second portion extending outward of the fourth electrode. The second portion extends from the first portion in a first direction from the first electrode toward the second electrode.

9 Claims, 14 Drawing Sheets

(51) Int. Cl.
  *H01L 29/40*    (2006.01)
  *H01L 29/66*    (2006.01)
  *H01L 29/06*    (2006.01)
  *H01L 29/417*   (2006.01)

(52) U.S. Cl.
  CPC .. *H01L 29/66734* (2013.01); *H01L 29/41766* (2013.01); *H01L 29/4236* (2013.01); *H01L 29/42376* (2013.01)

(56) References Cited

U.S. PATENT DOCUMENTS

| | | |
|---|---|---|
| 2012/0313161 A1 | 12/2012 | Grivna et al. |
| 2013/0069150 A1 | 3/2013 | Matsuoka et al. |
| 2013/0134505 A1 | 5/2013 | Kobayashi |
| 2014/0312414 A1 | 10/2014 | Cheng |
| 2016/0300914 A1 | 10/2016 | Sedlmaier et al. |
| 2018/0286944 A1 | 10/2018 | Meiser |
| 2019/0088776 A1 | 3/2019 | Shimomura et al. |
| 2019/0280094 A1 | 9/2019 | Grote |
| 2020/0259011 A1 | 8/2020 | Arai |

FOREIGN PATENT DOCUMENTS

| | | |
|---|---|---|
| JP | 2013-115225 A | 6/2013 |
| JP | 2019-57596 A | 4/2019 |
| JP | 2019-176104 A | 10/2019 |
| JP | 2020-129646 A | 8/2020 |

SEMICONDUCTOR DEVICE

CROSS-REFERENCE TO RELATED APPLICATIONS

This application is a continuation of application Ser. No. 17/005,694 filed Aug. 28, 2020 and is based upon and claims the benefit of priority from Japanese Patent Application No. 2019-235773, filed on Dec. 26, 2019; the entire contents of which are incorporated herein by reference.

FIELD

Embodiments relate to a semiconductor device.

BACKGROUND

It is desirable for a semiconductor device for power control to have a high breakdown voltage and a low ON-resistance. For example, a high breakdown voltage and a low ON-resistance are achieved in a MOSFET having a trench gate structure in which a field plate is provided inside a gate trench in addition to a gate electrode. However, there are cases where disposing the field plate inside the gate trench makes the source-gate parasitic capacitance to increase.

DETAILED DESCRIPTION

Figure 1:
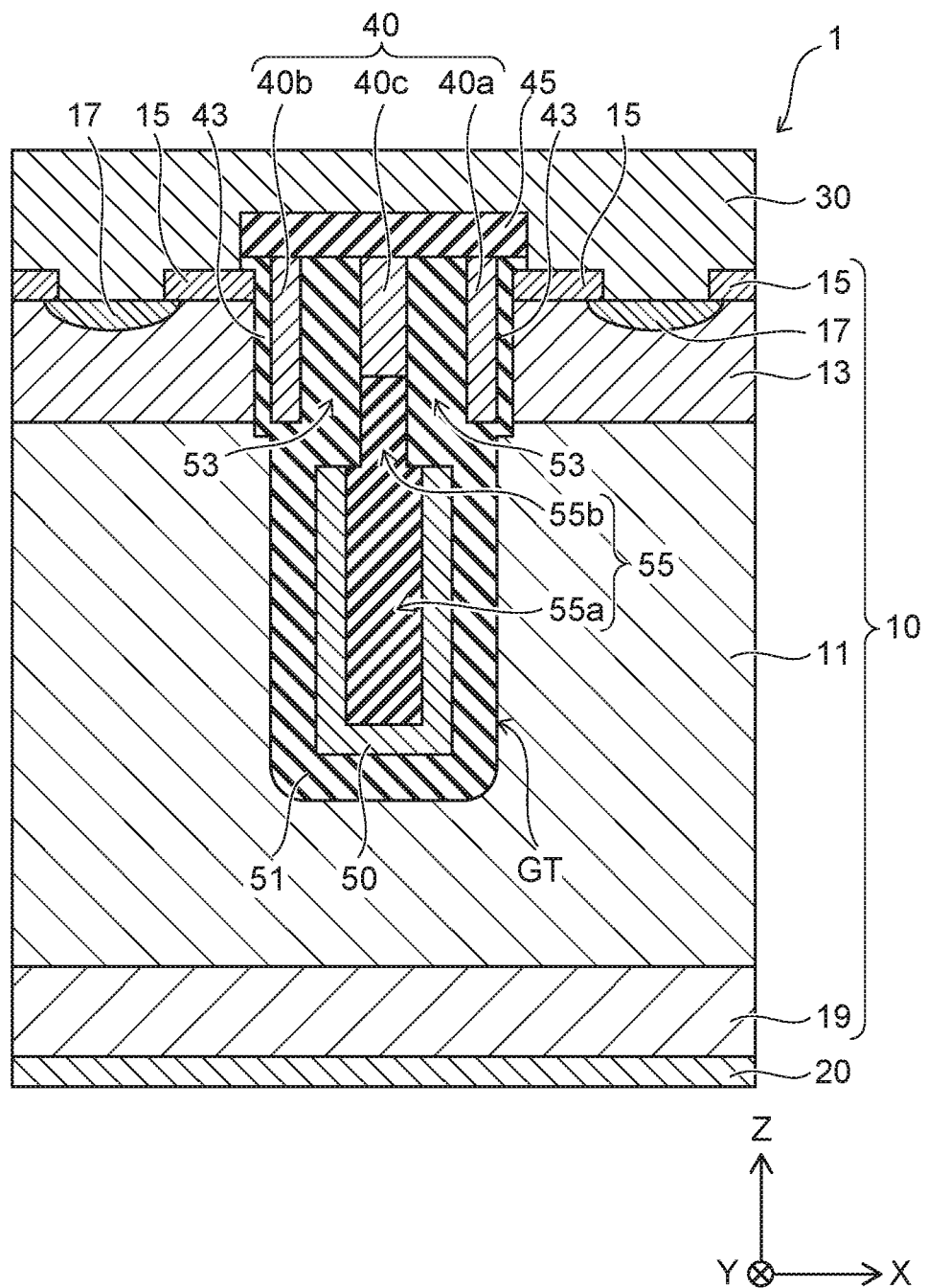
FIG. 1 is a schematic cross-sectional view showing a semiconductor device according to an embodiment.

According to one embodiment, a semiconductor device includes a semiconductor part; a first electrode on a back surface of the semiconductor part; a second electrode on a front surface of the semiconductor part; a third electrode provided between the semiconductor part and the second electrode, the semiconductor part having a trench at the front surface side, the third electrode being provided inside the trench of the semiconductor part; a fourth electrode provided inside the trench of the semiconductor part, the fourth electrode being provided between the first electrode and the third electrode; a first insulating portion electrically insulating the third electrode from the semiconductor part; a second insulating portion electrically insulating the third electrode from the second electrode; a third insulating portion electrically insulating the fourth electrode from the semiconductor part; a fourth insulating portion electrically insulating the fourth electrode from the third electrode; and a fifth insulating portion including a first portion and a second portion, the first portion being provided inside the fourth electrode, the second portion extending outward of the fourth electrode, the second portion extending from the first portion in a first direction from the first electrode toward the second electrode. The semiconductor part includes a first semiconductor layer of a first conductivity type, a second semiconductor layer of a second conductivity type, and a third semiconductor layer of the first conductivity type. The first semiconductor layer extends between the first and second electrodes. The second semiconductor layer is provided between the first semiconductor layer and the second electrode, the second semiconductor layer facing the third electrode via the first insulating portion. The third semiconductor layer is selectively provided between the second semiconductor layer and the second electrode, the third semiconductor layer contacting the first insulating portion and being electrically connected to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a trench-gate MOSFET.

The semiconductor device 1 includes a semiconductor part 10, a first electrode (e.g., a drain electrode 20), a second electrode (e.g., a source electrode 30), a third electrode (e.g., a gate electrode 40), and a fourth electrode (e.g., a field plate 50).

The semiconductor part 10 is provided between the drain electrode 20 and the source electrode 30. The semiconductor part 10 is, for example, silicon.

The drain electrode 20 is provided on the back surface of the semiconductor part 10. The drain electrode 20 is, for example, a metal layer including titanium, aluminum, gold, etc. There are cases where the drain electrode 20 is formed to have a continuous body with a metal material on a mounting substrate.

For example, the source electrode 30 is provided on the front surface of the semiconductor part 10. The source electrode 30 is, for example, a metal layer including aluminum.

For example, the gate electrode 40 is provided between the semiconductor part 10 and the source electrode 30. The gate electrode 40 is disposed inside a gate trench GT provided in the semiconductor part 10. The gate electrode 40 is, for example, conductive polysilicon.

The gate electrode 40 includes, for example, a first control portion 40a, a second control portion 40b, and a middle portion 40c. The first control portion 40a, the second control portion 40b, and the middle portion 40c are arranged in the lateral direction (e.g., the X-direction). The middle portion 40c is provided between the first control portion 40a and the second control portion 40b. For example, the first control portion 40a, the second control portion 40b, and the middle portion 40c are electrically connected to each other at a portion not-illustrated.

The field plate 50 (hereinbelow, the FP 50) is provided inside the gate trench GT with the gate electrode 40. The FP 50 is provided between the drain electrode 20 and the gate electrode 40. The gate electrode 40 is provided between the source electrode 30 and the FP 50. The FP 50 is, for example, conductive polysilicon. The FP 50 is electrically connected to the source electrode 30 at a portion not-illustrated.

As shown in FIG. 1, the semiconductor device 1 further includes a first insulating portion 43, a second insulating portion 45, a third insulating portion 51, a fourth insulating portion 53, and a fifth insulating portion 55.

The first insulating portion 43 electrically insulates the gate electrode 40 from the semiconductor part 10. The first insulating portion 43 is provided between the semiconductor part 10 and the first control portion 40a and between the semiconductor part 10 and the second control portion 40b. The first insulating portion 43 serves as a gate insulating film. The first insulating portion 43 is, for example, a silicon oxide film.

The second insulating portion 45 electrically insulates the gate electrode 40 from the source electrode 30. The second insulating portion 45 is, for example, an inter-layer insulating film provided between the source electrode 30 and the gate electrode 40. The second insulating portion 45 is, for example, a silicon oxide film.

The third insulating portion 51 is provided between the semiconductor part 10 and the FP 50. The third insulating portion 51 electrically insulates the FP 50 from the semiconductor part 10. The third insulating portion 51 is, for example, a silicon oxide film.

The fourth insulating portion 53 is provided between the FP 50 and the first control portion 40a of the gate electrode 40 and between the FP 50 and the second control portion 40b of the gate electrode 40. The fourth insulating portion 53 electrically insulates the FP 50 from the gate electrode 40. The fourth insulating portion 53 also is provided between the first control portion 40a and the middle portion 40c and between the second control portion 40b and the middle portion 40c. The fourth insulating portion 53 is, for example, a silicon oxide film.

The fifth insulating portion 55 includes a first portion 55a that is provided inside the FP 50, and a second portion 55b extending outward of the FP 50. The second portion is provided to extend in the Z-direction from the first portion 55a inside the FP 50. The second portion 55b is provided between the gate electrode 40 and the first portion 55a. The second portion 55b serves as a spacer between the gate electrode 40 and the FP 50. The second portion 55b reduces the parasitic capacitance between the gate electrode 40 and the FP 50. The fifth insulating portion 55 is, for example, so-called BPSG, i.e., silicate glass including boron and phosphorus. For example, the FP 50 has a U-shaped cross section, and the first portion 55a of the fifth insulating portion 55 is inside the FP 50.

As shown in FIG. 1, the semiconductor part 10 includes, for example, an n-type drift layer 11, a p-type diffusion layer 13, an n-type source layer 15, a p-type contact layer 17, and an n-type drain layer 19.

The n-type drift layer 11 includes a low-concentration n-type impurity. The n-type drift layer 11 has a thickness that can provide the desired breakdown voltage in the OFF-state of the semiconductor device 1. The FP 50 is positioned inside the n-type drift layer 11 and faces the n-type drift layer 11 via the third insulating portion 51.

The p-type diffusion layer 13 is provided between the n-type drift layer 11 and the source electrode 30. The p-type diffusion layer 13 faces the first control portion 40a and the second control portion 40b of the gate electrode 40 via the first insulating portion 43.

The n-type source layer 15 is selectively provided between the p-type diffusion layer 13 and the source electrode 30. The n-type source layer 15 is provided to contact the first insulating portion 43. The n-type source layer 15 includes an n-type impurity with a higher concentration than a concentration of the n-type impurity in the n-type drift layer 11.

The p-type contact layer 17 is selectively provided between the p-type diffusion layer 13 and the source electrode 30. The p-type contact layer 17 includes a p-type impurity with a higher concentration than a concentration of the p-type impurity in the p-type diffusion layer 13.

For example, the source electrode 30 contacts the n-type source layer 15 and the p-type contact layer 17 and is electrically connected thereto. The source electrode 30 is electrically connected to the p-type diffusion layer 13 via the p-type contact layer 17.

The n-type drain layer 19 is provided between the n-type drift layer 11 and the drain electrode 20. The n-type drain layer 19 includes an n-type impurity with a higher concentration than the concentration of the n-type impurity in the n-type drift layer 11. For example, the drain electrode 20 contacts the n-type drain layer 19 and is electrically connected thereto.

A method for manufacturing the semiconductor device 1 according to the embodiment will now be described with reference to FIG. 2A to FIG. 7B. FIGS. 2A to 7B are schematic cross-sectional views showing manufacturing processes of the semiconductor device 1.

Figure 2A:
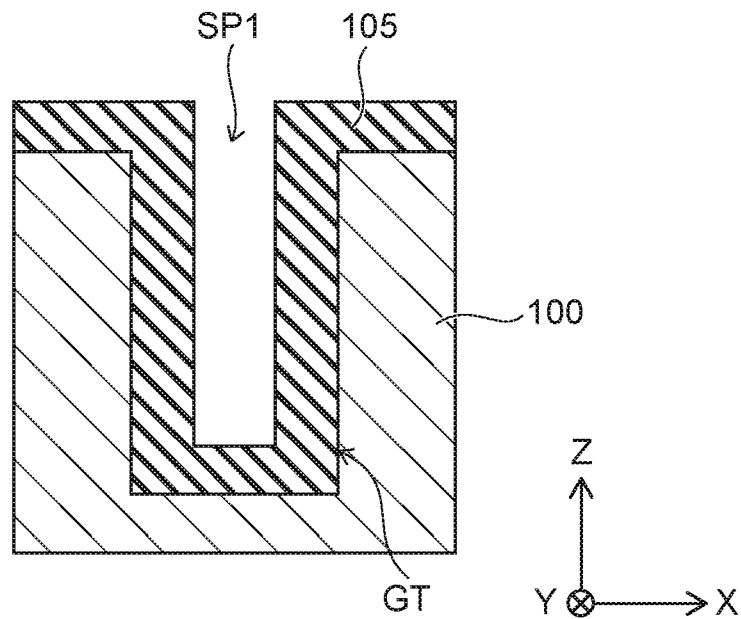
FIGS. 2A to 7B are schematic cross-sectional views showing manufacturing processes of the semiconductor device according to the embodiment.

As shown in FIG. 2A, the gate trench GT is formed in a semiconductor wafer 100; subsequently, an insulating film 105 that covers the inner surface of the gate trench GT is formed. The semiconductor wafer 100 is, for example, an n-type silicon wafer. The semiconductor wafer 100 includes an n-type impurity with the same concentration as the concentration of the n-type impurity in the n-type drift layer 11.

For example, the gate trench GT is formed by selectively removing the semiconductor wafer by using anisotropic RIE (Reactive Ion Etching). For example, the insulating film 105 is formed by thermal oxidation of the semiconductor wafer 100. The insulating film 105 is, for example, a silicon oxide film. The insulating film 105 is formed so that a space SP1 remains inside the gate trench GT.

Figure 2B:
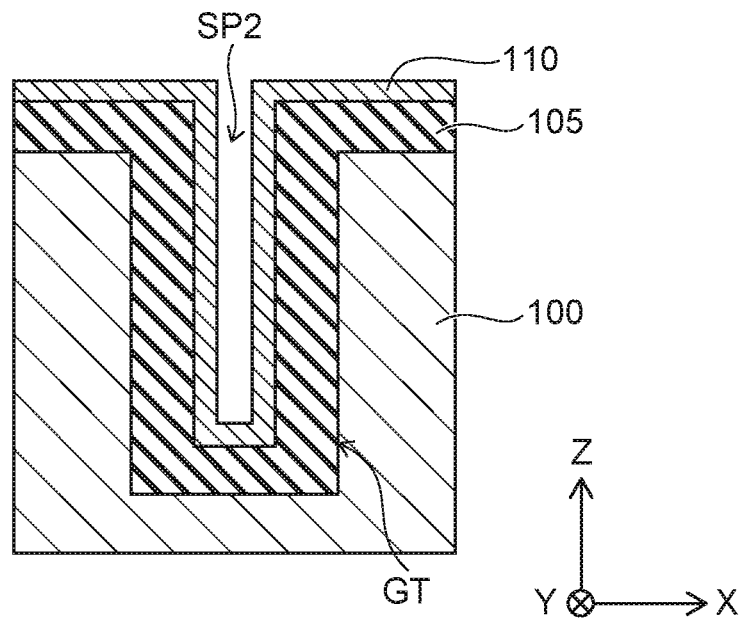

As shown in FIG. 2B, a conductive film 110 is formed on the insulating film 105. The conductive film 110 is formed inside the gate trench GT to cover the insulating film 105 so that a space SP2 remains.

The conductive film 110 is, for example, a polysilicon film formed using CVD (Chemical Vapor Deposition). The conductive film 110 includes, for example, an n-type impurity doped by vapor phase diffusion. Alternatively, the conductive film 110 may include, for example, an n-type impurity doped in the deposition process.

Figure 3A:
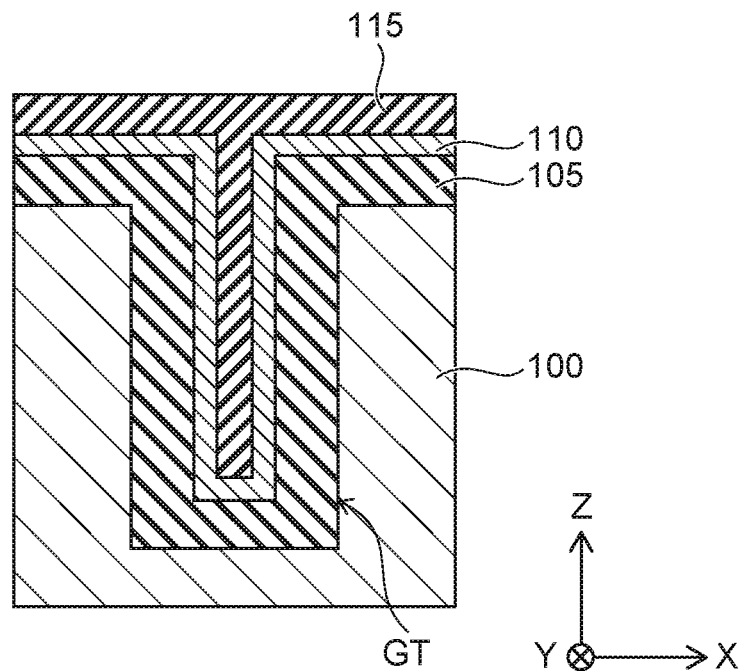

As shown in FIG. 3A, an insulating film 115 is formed to fill the space SP2 inside the gate trench GT (referring to FIG. 2B). The insulating film 115 is, for example, a BPSG film deposited by using CVD. After the insulating film 115 is formed, heat treatment of the insulating film 115 is performed at a temperature higher than the softening point of the BPSG film so that voids and the like do not remain inside the gate trench GT.

Figure 3B:
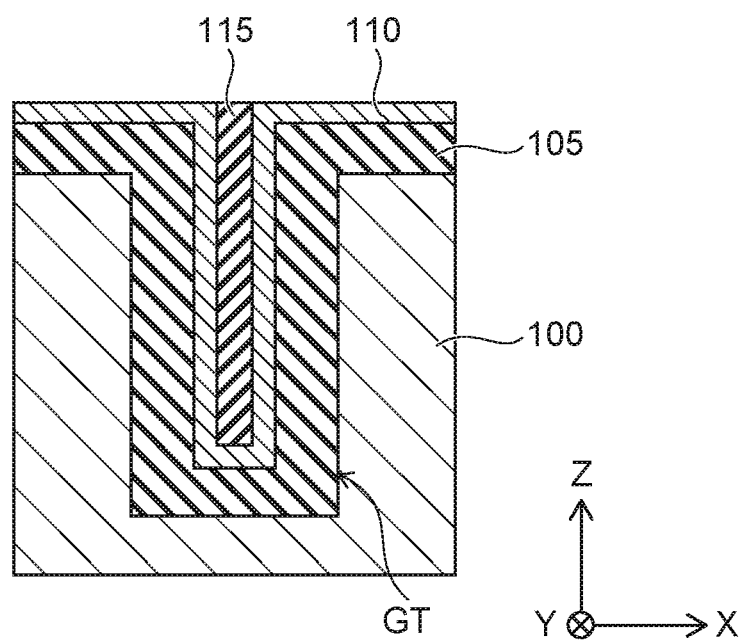

As shown in FIG. 3B, the insulating film 115 is removed so that a portion of the insulating film 115 remains inside the gate trench GT. The insulating film 115 is selectively removed using, for example, dry etching so that the front surface of the conductive film 110 is exposed.

Figure 4A:
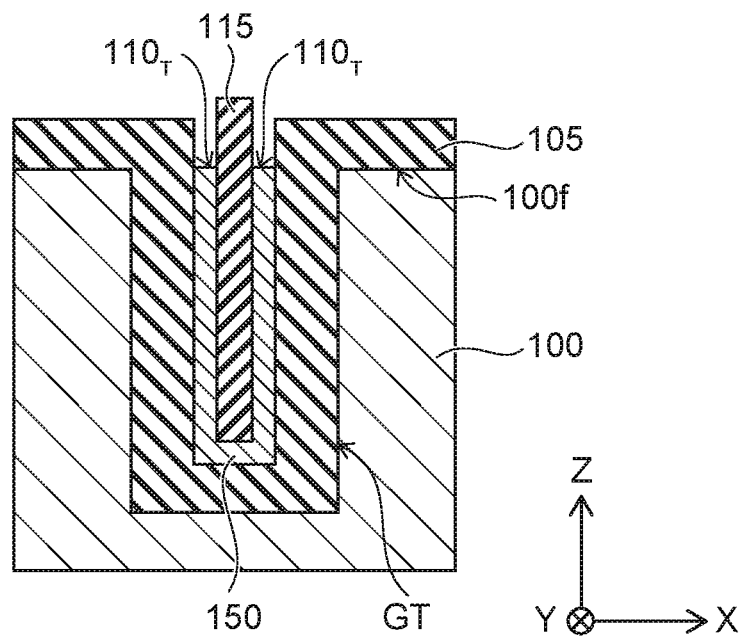

As shown in FIG. 4A, the conductive film 110 is selectively removed so that a portion of the conductive film 110 remains inside the gate trench GT. For example, the conductive film 110 is removed so that an upper end 110T of the portion remaining inside the gate trench GT is provided at the same level in the Z direction as a front surface 100f of the semiconductor wafer 100.

Figure 4B:
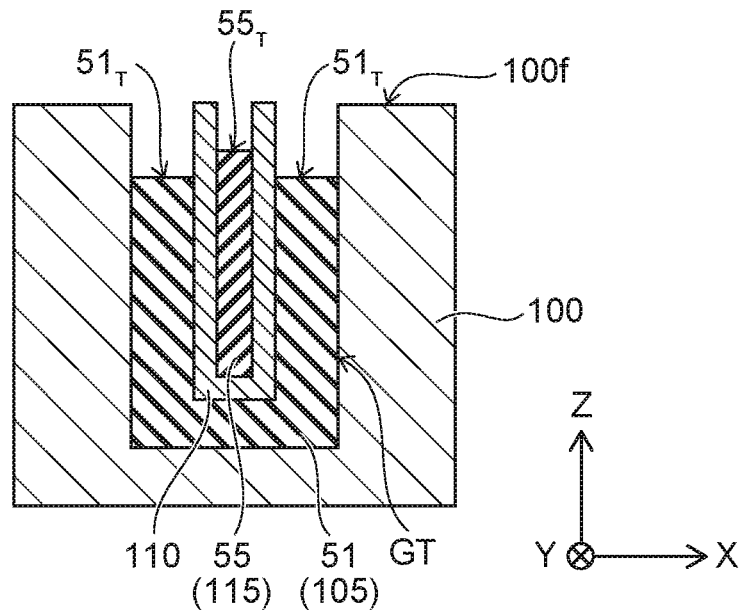

As shown in FIG. 4B, the insulating film 105 and the insulating film 115 are selectively removed so that portions of the insulating film 105 and the insulating film 115 remain inside the gate trench GT. Thereby, the third insulating portion 51 and the fifth insulating portion 55 are formed inside the gate trench GT. An upper end 51T of the third insulating portion 51 and an upper end 55T of the fifth insulating portion 55 are positioned at a lower level than the front surface 100f of the semiconductor wafer 100.

For example, the insulating films 105 and 115 are selectively removed by wet etching. For example, the etching of the insulating films 105 and 115 is performed at conditions such that the etching rate of the insulating film 105 is faster than the etching rate of the insulating film 115. Therefore, the upper end 55T of the fifth insulating portion 55 is provided at a higher level than the upper end 51T of the third insulating portion 51.

Figure 5A:
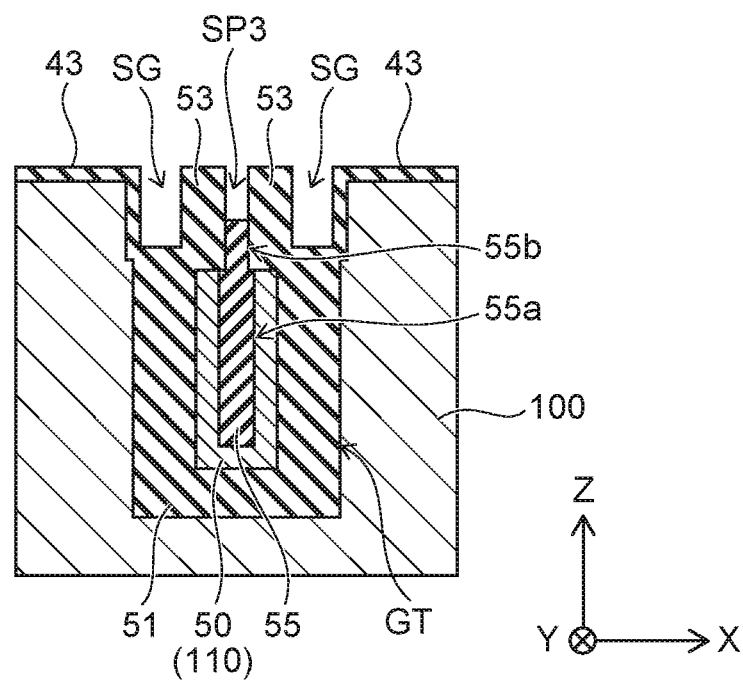

As shown in FIG. 5A, the first insulating portion 43 is formed by thermal oxidation of the semiconductor wafer 100. Simultaneously, the fourth insulating portion 53 is formed by the thermal oxidation at a portion of the conductive film 110 extending between the third insulating portion 51 and the fifth insulating portion 55. Thereby, the FP 50 is formed at the lower portion of the gate trench GT. The first insulating portion 43 and the fourth insulating portion 53 are, for example, silicon oxide films.

For example, the film thickness of the conductive film 110 is set so that the entire portion of the conductive film 110 exposed in the space inside the gate trench GT is oxidized in the thermal oxidation process for forming the first insulating portion 43. In other words, the film thickness of the conductive film 110 is set so that the entire exposed portion of the conductive film 110 undergoes thermal oxidation when using conditions forming a thermal oxide film so that the first insulating portion 43 has a thickness that can serves as the gate insulating film.

For example, the thermal oxidation of the semiconductor wafer 100 and the conductive film 110 is performed at a temperature that is higher than the softening point of the BPSG included in the fifth insulating portion 55. Therefore, the second portion 55b of the fifth insulating portion 55 is compressed by the volume expansion due to the thermal oxidation of the exposed portion of the conductive film 110.

As a result, for example, the width in the X-direction of the second portion 55b of the fifth insulating portion 55 is less than the width in the X-direction of the first portion 55a.

The first insulating portion 43 and the fourth insulating portion 53 are formed in the upper portion of the gate trench GT so that spaces SG and SP3 remain. The space SG is formed between the first insulating portion 43 and the fourth insulating portion 53. Also, the space SG is formed on the third insulating portion 51. For example, the width in the X-direction of the space SG is less than the width in the X-direction of the third insulating portion 51. The space SP3 is formed on the second portion 55b of the fifth insulating portion 55.

Figure 5B:
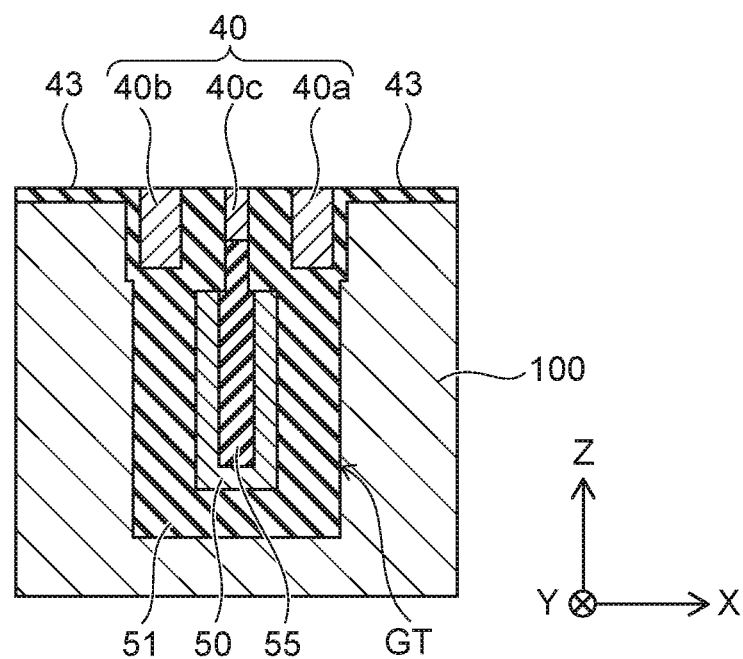

As shown in FIG. 5B, the gate electrode 40 is formed to fill the spaces SG and SP3 at the upper portion of the gate trench GT. The gate electrode 40 includes the first control portion 40a, the second control portion 40b, and the middle portion 40c. The first control portion 40a and the second control portion 40b are formed to fill the spaces SG, and the middle portion 40c is formed to fill the space SP3. The gate electrode 40 is, for example, conductive polysilicon. For example, the widths in the X-direction of the first control portion 40a and the second control portion 40b are less than the width in the X-direction of the third insulating portion 51.

Figure 6A:
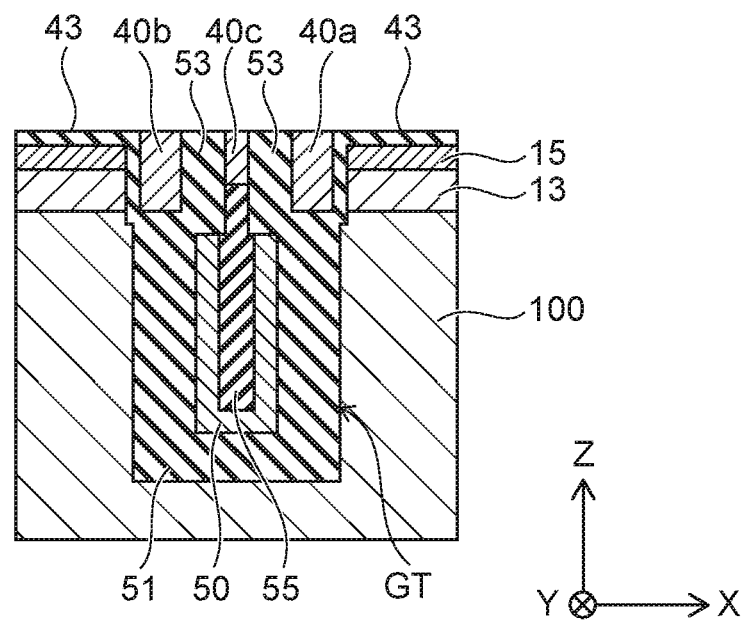

As shown in FIG. 6A, the p-type diffusion layer 13 and the n-type source layer 15 are formed at the front surface of the semiconductor wafer 100.

The p-type diffusion layer 13 is formed by ion-implanting a p-type impurity, e.g., boron (B) into the semiconductor wafer 100 and by performing thermal diffusion. The p-type diffusion layer 13 is formed so that the lower surface of the p-type diffusion layer 13 is positioned at the same level in the Z direction as the lower ends of the first control portion 40a and the second control portion 40b of the gate electrode 40 or at a higher level than the lower ends thereof.

The n-type source layer 15 is formed by ion-implanting an n-type impurity, e.g., phosphorus (P) into the semiconductor wafer 100. The n-type source layer 15 is formed so that the lower surface of the n-type source layer 15 is at a higher level in the Z direction than the lower surface of the p-type diffusion layer 13.

The p-type diffusion layer 13 and the n-type source layer 15 contact the first insulating portion 43. The p-type diffusion layer 13 faces the first control portion 40a and the second control portion 40b of the gate electrode 40 via the first insulating portion 43.

Figure 6B:
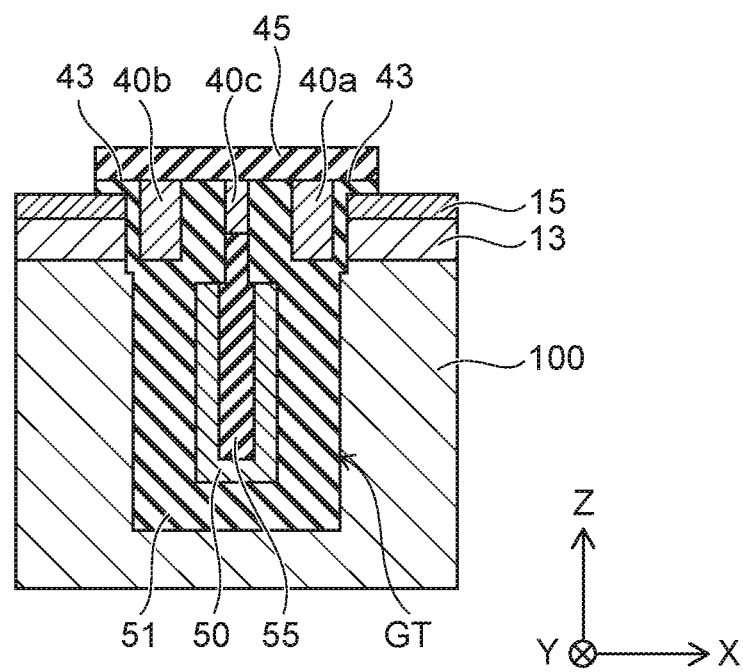

As shown in FIG. 6B, the second insulating portion 45 is formed on the gate electrode 40. The second insulating portion 45 is, for example, a silicon oxide film formed using CVD. For example, after a silicon oxide film is formed on the semiconductor wafer 100, the silicon oxide film is selectively removed to expose the n-type source layer 15 and to make the portion covering the gate electrode 40 remain. At this time, a portion of the first insulating portion 43 covering the n-type source layer 15 also is removed.

Figure 7A:
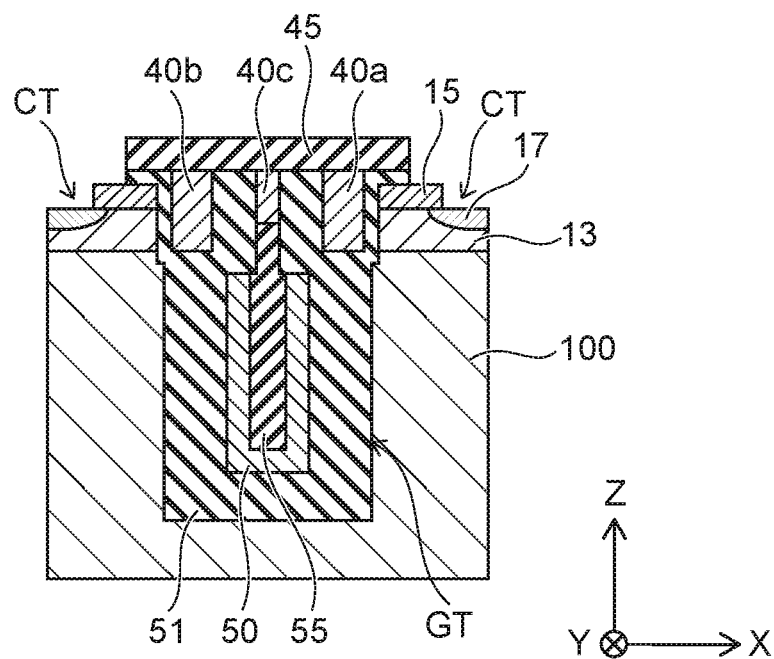

As shown in FIG. 7A, a contact trench CT is formed by selectively removing a portion of the n-type source layer 15. At this time, for example, the p-type diffusion layer 13 is exposed at the bottom surface of the contact trench CT.

Continuing, the p-type contact layer 17 is formed on the p-type diffusion layer 13 by ion-implanting a p-type impurity, e.g., boron (B) into the front surface of the semiconductor wafer 100. The p-type contact layer 17 is formed so that the lower surface of the p-type contact layer 17 is provided at a higher level in the Z direction than the lower surface of the p-type diffusion layer 13.

Figure 7B:
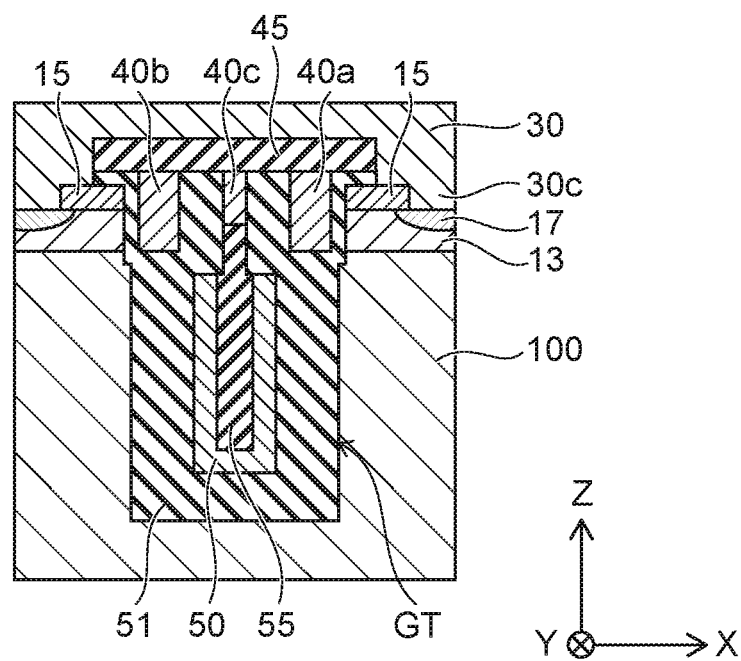

As shown in FIG. 7B, the source electrode 30 is formed at the front surface of the semiconductor wafer 100. The source electrode 30 is, for example, a metal film including aluminum which is formed using sputtering.

The source electrode 30 covers the n-type source layer 15 and the second insulating portion 45 and extends inside the contact trench CT. The source electrode 30 contacts the n-type source layer 15 and the p-type contact layer 17. Also, the source electrode 30 is electrically connected to the FP 50 at a portion not-illustrated.

Continuing, the n-type drain layer 19 is formed after thinning the back surface of the semiconductor wafer 100 to a prescribed thickness by etching or polishing (referring to FIG. 1). The n-type drain layer 19 is formed by ion-implanting an n-type impurity, e.g., phosphorus (P) into the back surface of the semiconductor wafer 100.

The semiconductor device 1 is completed by forming the drain electrode 20 on the n-type drain layer 19. A portion of the semiconductor wafer 100 remaining between the p-type diffusion layer 13 and the n-type drain layer 19 is the n-type drift layer 11.

In the method for manufacturing the semiconductor device 1 according to the embodiment, the distance is increased between the FP 50 and the middle portion 40c of the gate electrode 40 by the second portion 55b of the fifth insulating portion 55 (referring to FIG. 1) that remains in the manufacturing process shown in FIG. 4B. Also, the spacing is increased respectively between the FP 50 and the first control portion 40a and between the FP 50 and the second control portion 40b by thermally oxidizing the exposed portion of the conductive film 110 that is expanded in volume. Thereby, it is possible to reduce the parasitic capacitance between the gate electrode 40 and the FP 50, i.e., the parasitic capacitance between the gate electrode 40 and the source electrode 30.

The surface area of the upper end of the FP 50 can be reduced by providing the first portion 55a of the fifth insulating portion 55 inside the FP 50. Thereby, the parasitic capacitance between the gate electrode 40 and the FP 50 can be reduced further.

Figure 8:
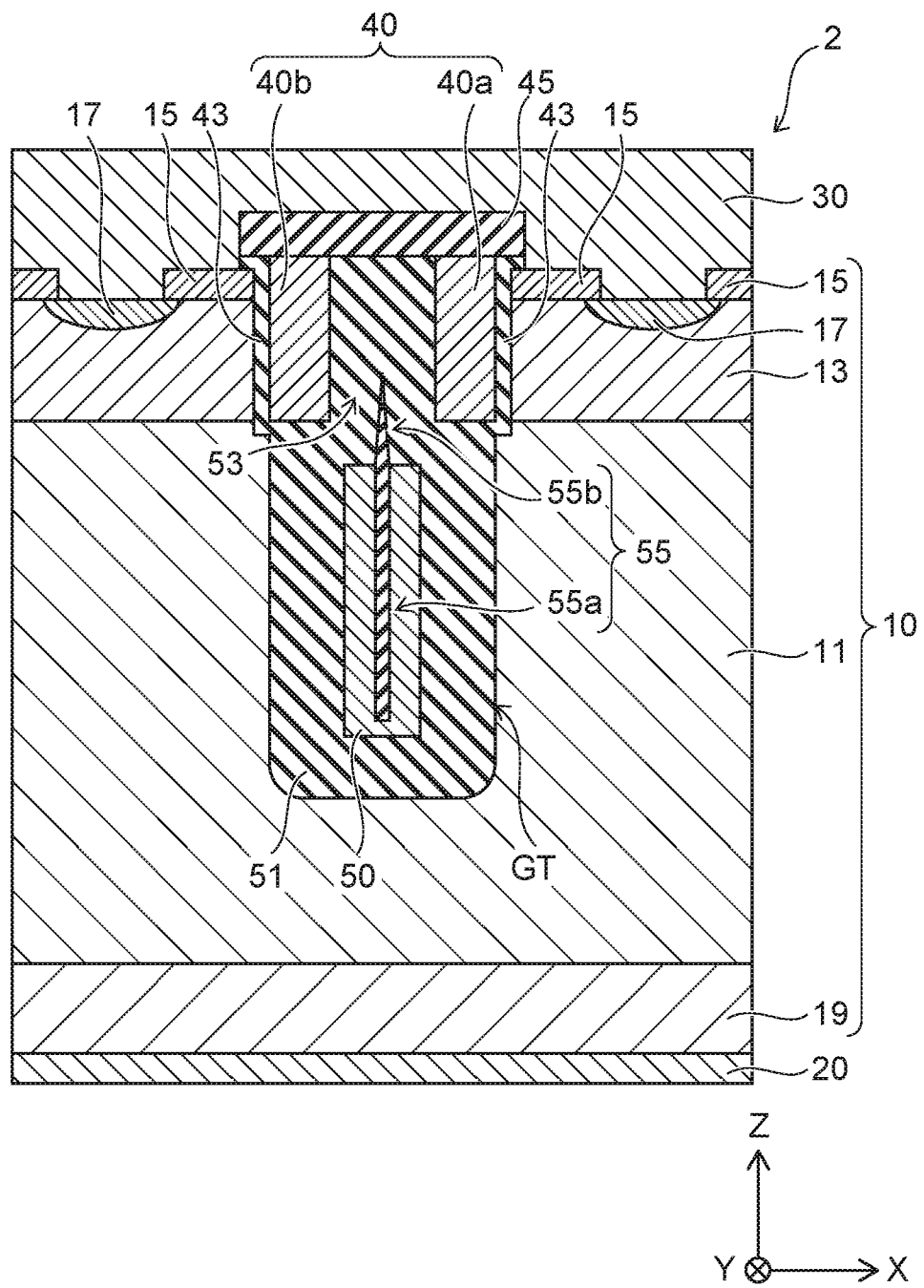
FIG. 8 is a schematic cross-sectional view showing a semiconductor device according to a first modification of the embodiment.

FIG. 8 is a schematic cross-sectional view showing a semiconductor device 2 according to a first modification of the embodiment. The gate electrode 40 of the semiconductor device 2 includes the first control portion 40a and the second control portion 40b but does not include the middle portion 40c (referring to FIG. 1). Thereby, the parasitic capacitance between the gate electrode 40 and the FP 50 can be reduced further.

Figure 9A:
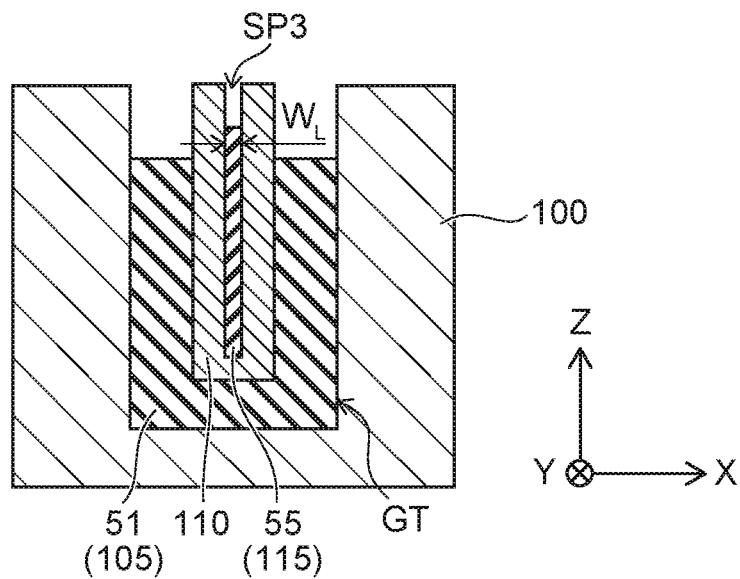
FIGS. 9A to 9C are schematic cross-sectional views showing manufacturing processes of the semiconductor device according to the first modification of the embodiment.
Figure 9B:
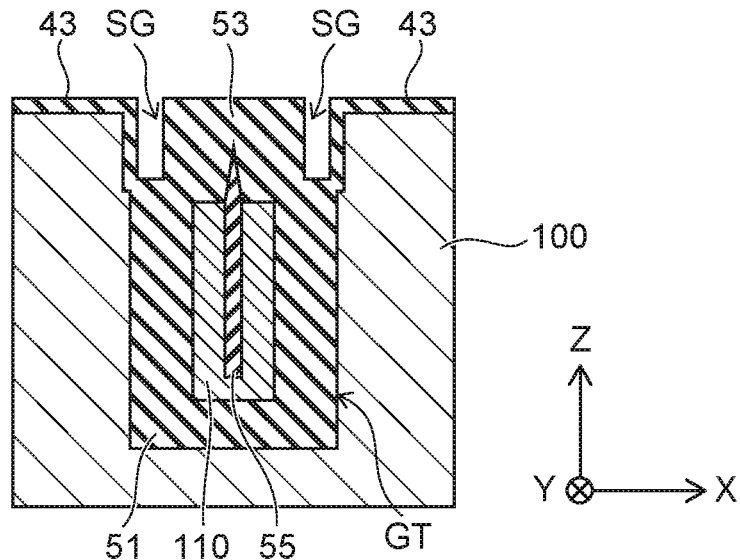
Figure 9C:
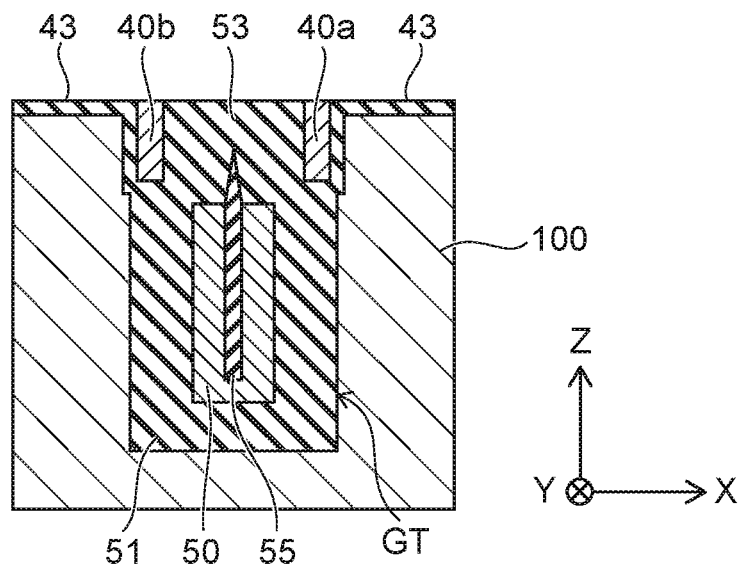

FIGS. 9A to 9C are schematic cross-sectional views showing manufacturing processes of the semiconductor device according to the first modification of the embodiment. The manufacturing processes shown in FIGS. 9A to 9C correspond to the manufacturing processes shown in FIG. 4B to FIG. 5B.

As shown in FIG. 9A, the third insulating portion 51 and the fifth insulating portion 55 are formed inside the gate trench GT by selectively removing the insulating films 105 and 115. A width WL in the X-direction of the fifth insulating portion 55 is formed to be narrow compared to the width in the X-direction of the fifth insulating portion 55 shown in FIG. 4B. Therefore, the width in the X-direction of the space SP3 formed on the fifth insulating portion 55 also is reduced.

As shown in FIG. 9B, the first insulating portion 43 and the fourth insulating portion 53 are formed by the thermal oxidation of the semiconductor wafer 100 and the exposed portion of the conductive film 110. In this process, the space SP3 that is provided on the fifth insulating portion 55 is plugged. In other words, the space SP3 is plugged due to the volume expansion of the fourth insulating portion 53 because the width in the X-direction of the space SP3 is narrow. For example, the fifth insulating portion 55 is formed so that the width in the X-direction of the portion extending in the Z-direction toward the outside of the FP 50 becomes narrower toward the tip.

As shown in FIG. 9C, the gate electrode 40 are formed by filling the first control portion 40a and the second control portion 40b into the spaces SG between the first insulating portion 43 and the fourth insulating portion 53.

Figure 10:
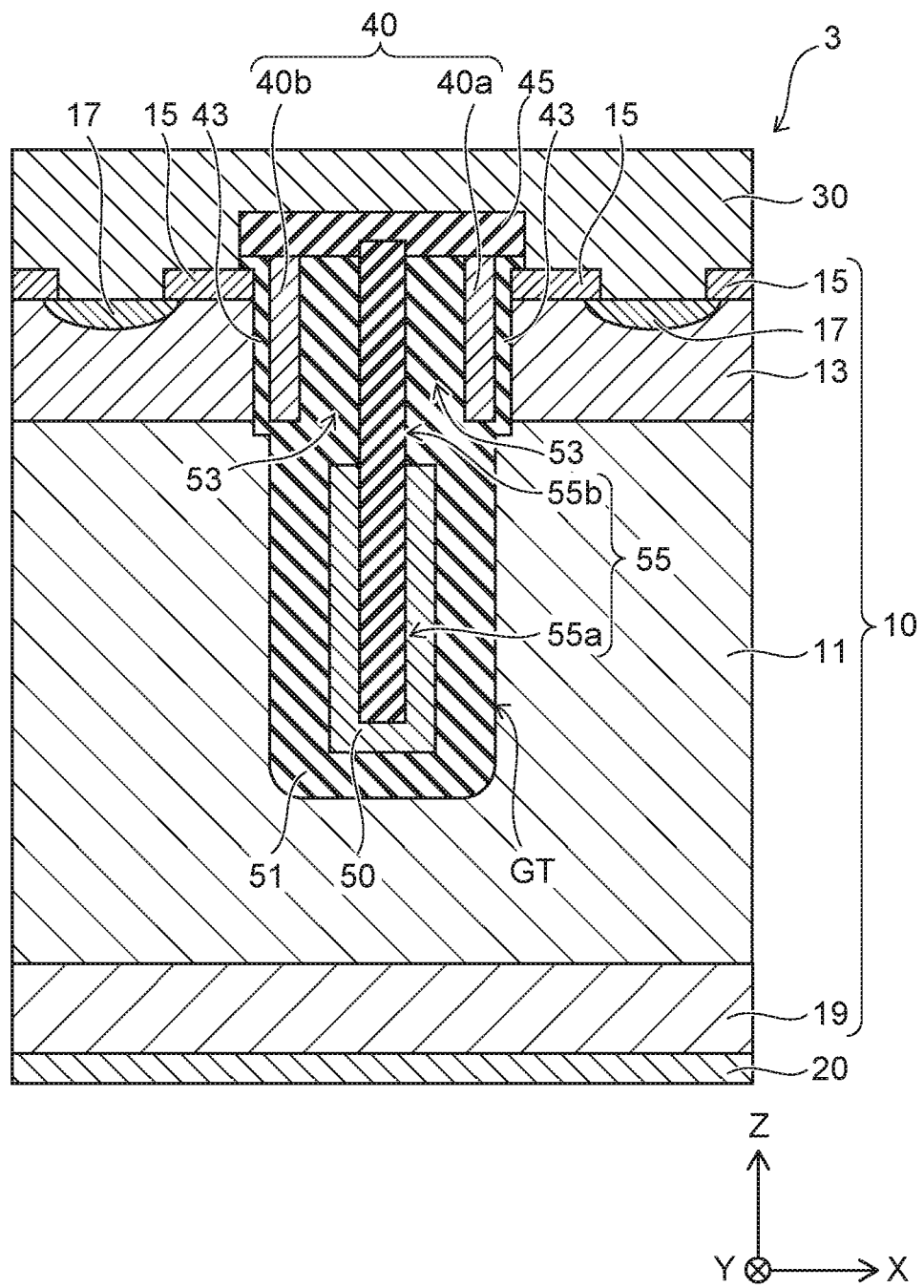
FIG. 10 is a schematic cross-sectional view showing a semiconductor device according to a second modification of the embodiment.

FIG. 10 is a schematic cross-sectional view showing a semiconductor device 3 according to a second modification of the embodiment. The gate electrode 40 of the semiconductor device 3 includes the first control portion 40a and the second control portion 40b but does not include the middle portion 40c (referring to FIG. 1). The parasitic capacitance between the gate electrode 40 and the FP 50 can be reduced thereby.

The second portion 55b of the fifth insulating portion 55 is connected to the second insulating portion 45. The fourth insulating portion 53 is positioned between the first control portion 40a of the gate electrode 40 and the second portion 55b and between the second control portion 40b and the second portion 55b.

FIG. 11A to FIG. 12B are schematic cross-sectional views showing manufacturing processes of the semiconductor device 3 according to the second modification of the embodiment. The manufacturing processes shown in FIG. 11A to FIG. 12B correspond to the manufacturing processes shown in FIG. 4A to FIG. 5B.

Figure 11A:
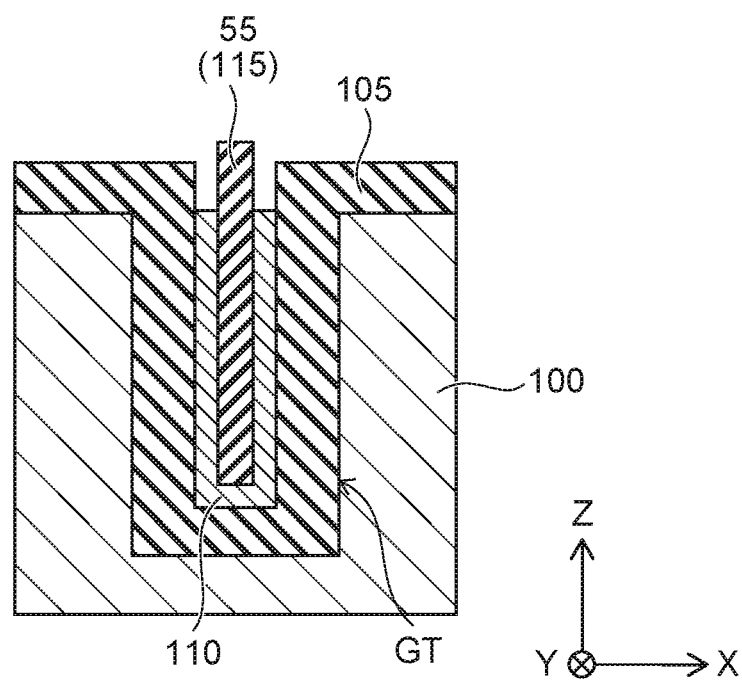
FIGS. 11A to 12B are schematic cross-sectional views showing manufacturing processes of the semiconductor device according to the second modification of the embodiment.

As shown in FIG. 11A, the conductive film 110 is selectively removed so that the portion of the conductive film 110 remains inside the gate trench GT. At this stage, the insulating film 115 remains as the fifth insulating portion 55 (referring to FIG. 3B).

Figure 11B:
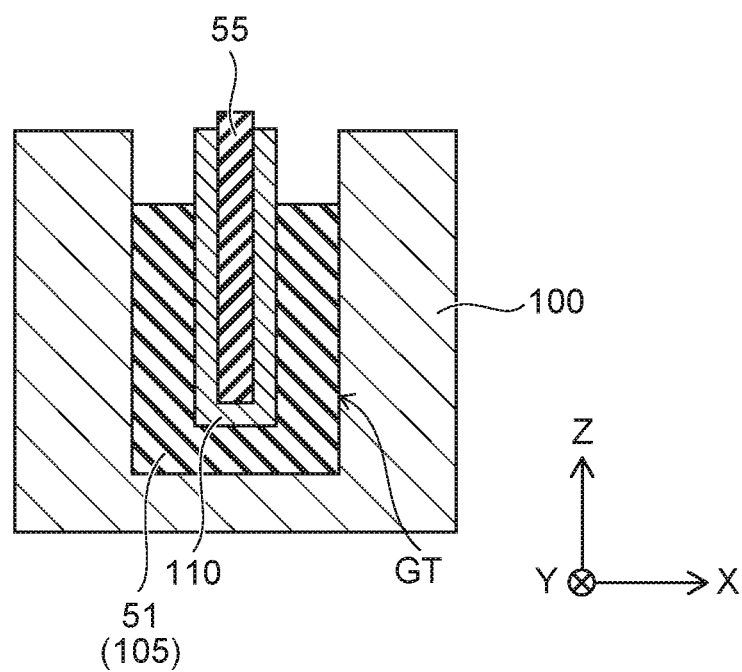

As shown in FIG. 11B, the third insulating portion 51 is formed by selectively removing the insulating film 105. For example, the insulating film 105 is selectively removed under the conditions at which the insulating film 115 is not etched. The insulating film 115 includes a material different from the insulating film 105. The insulating film 105 is, for example, a silicon oxide film; and the insulating film 115 is, for example, a silicon nitride film.

Figure 12A:
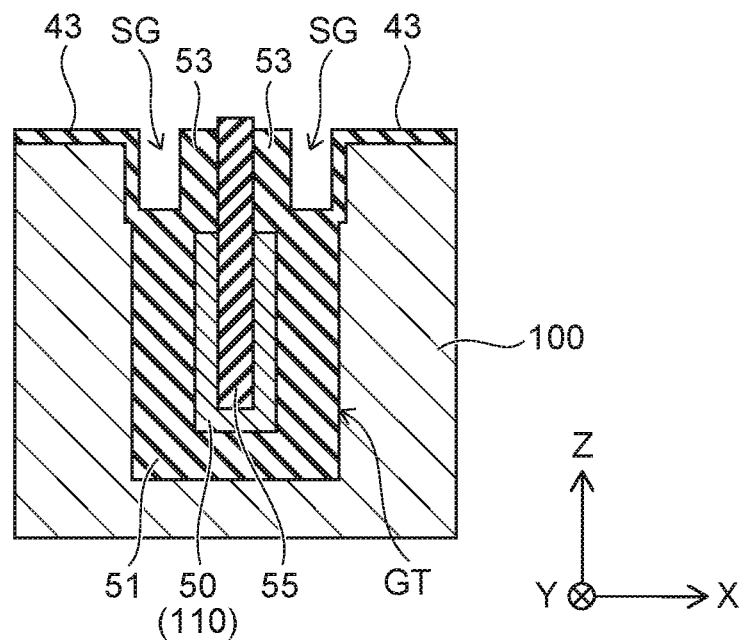

As shown in FIG. 12A, the first insulating portion 43 and the fourth insulating portion 53 are formed by thermally oxidizing the semiconductor wafer 100 and the exposed portion of the conductive film 110. The fourth insulating portion 53 is provided between the first insulating portion 43 and the fifth insulating portion 55. The fourth insulating portion 53 is formed so that the spaces SG remain between the first insulating portion 43 and the fourth insulating portion 53.

Figure 12B:
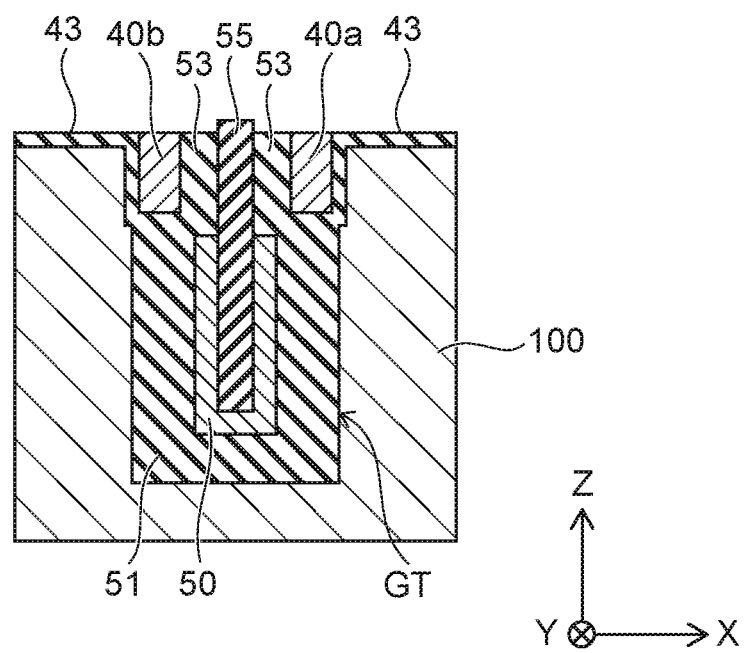

As shown in FIG. 12B, the gate electrode 40 is formed by filling the first control portion 40a and the second control portion 40b into the spaces SG. Continuing, the second insulating portion 45 is formed to cover the gate electrode 40 (referring to FIG. 10).

Figure 13:
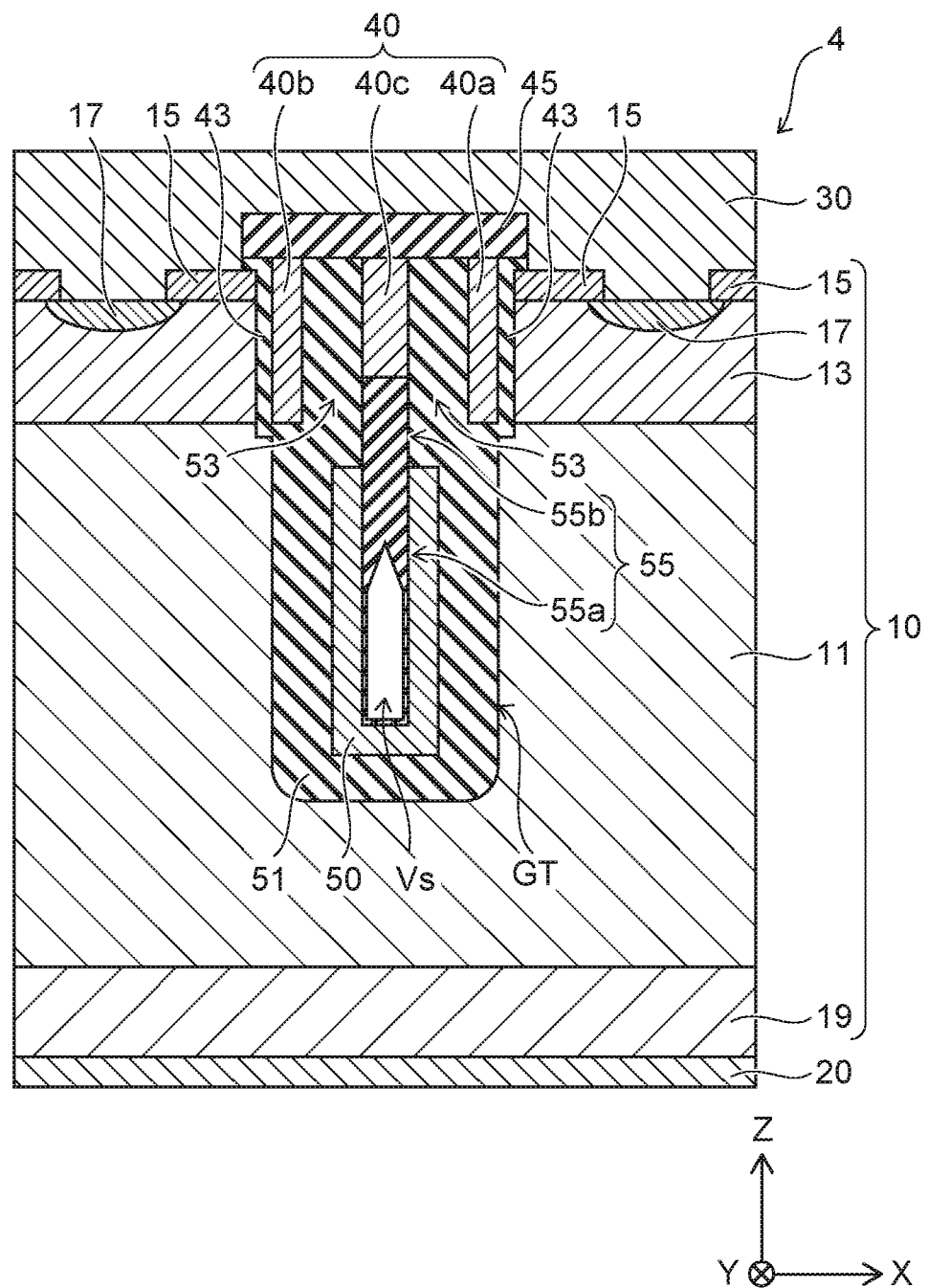
FIG. 13 is a schematic cross-sectional view showing a semiconductor device according to a third modification of the embodiment.

FIG. 13 is a schematic cross-sectional view showing a semiconductor device 4 according to a third modification of the embodiment. The fifth insulating portion 55 of the semiconductor device 4 includes, for example, a void Vs provided inside the FP 50.

The void Vs is positioned inside the first portion 55a of the fifth insulating portion 55. In the semiconductor device 4, the stress of the structure body formed inside the gate trench GT can be relaxed by the void Vs that remains therein. In the semiconductor device 3 as well, the parasitic capacitance between the gate electrode 40 and the FP 50 can be reduced by providing the fourth insulating portion 53 and the second portion 55b of the fifth insulating portion 55.

Figure 14A:
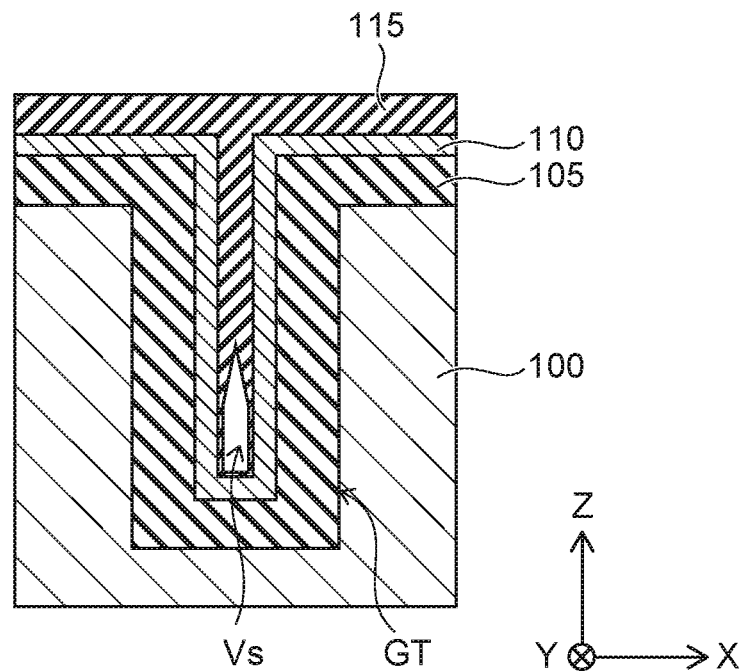
FIGS. 14A and 14B are schematic cross-sectional views showing manufacturing processes of the semiconductor device according to the third modification of the embodiment.
Figure 14B:
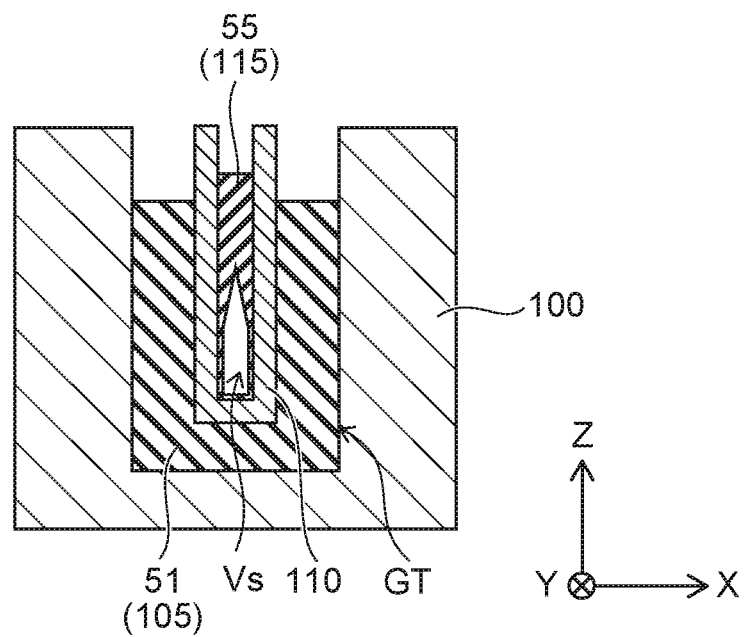

FIGS. 14A and 14B are schematic cross-sectional views showing manufacturing processes of the semiconductor device 4 according to the third modification of the embodiment. The manufacturing processes shown in FIGS. 14A and 14B correspond respectively to the manufacturing processes shown in FIG. 3A and FIG. 4B.

As shown in FIG. 14A, the insulating film 115 is formed to fill the space SP2 inside the gate trench GT (referring to FIG. 2B). The insulating film 115 is, for example, a silicon nitride film or a silicon oxynitride film formed by CVD. For example, by increasing the deposition rate of the insulating film 115 at the upper portion of the space SP2, the upper portion of the space SP2 is plugged first, and the void Vs remains at the bottom portion of the gate trench GT.

As shown in FIG. 14B, the third insulating portion 51 and the fifth insulating portion 55 are formed by selectively removing the insulating films 105 and 115. The insulating films 105 and 115 are selectively removed under the conditions such that the etching rate of the insulating film 115 is slower than the etching rate of the insulating film 105.

In the manufacturing method according to the embodiment, the insulating film 115 that is to be the fifth insulating portion 55 is formed inside the conductive film 110 that is to be the FP 50. Therefore, the film thickness of the conductive film 110 can be thin compared to a case in which the entire space SP1 inside the gate trench GT (referring to FIG. 2A) is filled with the conductive film 110. Thereby, it is possible to perform thermal oxidation of the entire exposed portion of the conductive film 110 (referring to FIG. 4B) in the process of forming the first insulating portion 43. In other words, a portion of the FP 50 can be prevented from remaining between the first control portion 40a and the second control portion 40b of the gate electrode 40; and, thus, the parasitic capacitance can be reduced between the gate electrode 40 and the FP 50.

In the process of etching the conductive film 110 so that a portion provided inside the gate trench GT remains (referring to FIG. 4A), a thin conductive film 110 provided between the insulating film 105 and the insulating film 115 is etched. Thereby, the control of the etching amount of the conductive film 110 is easy. Also, in the process of forming the third insulating portion 51 and the fifth insulating portion 55 by selectively removing the insulating films 105 and 115 (referring to FIG. 4B), similarly, the control of the etching amount is easy. As a result, it is possible to improve the reproducibility in the shape of the gate electrode 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a semiconductor part provided between the first electrode and the second electrode;
   a third electrode provided in the semiconductor part, the third electrode being positioned between the first electrode and the second electrode;
   a fourth electrode provided in the semiconductor part, the fourth electrode being positioned between the first electrode and the third electrode;
   a first insulating portion provided between the semiconductor part and the third electrode, the first insulating portion electrically insulating the third electrode from the semiconductor part;
   a second insulating portion provided between the second electrode and the third electrode, the second insulating portion electrically insulating the third electrode from the second electrode,
   a third insulating portion provided between the fourth electrode and the semiconductor part, the third insulating portion electrically insulating the fourth electrode from the semiconductor part;
   a fourth insulating portion provided between the third electrode and the fourth electrode, the fourth insulating portion electrically insulating the fourth electrode from the third electrode; and
   a fifth insulating portion provided inside the fourth electrode, the fourth electrode including a first portion, a second portion and a third portion, the fifth insulating portion being provided between the first portion and the second portion, the third portion being provided between the first electrode and the fifth insulating portion, the third portion being connected to the first portion and the second portion,
   the third electrode including a first control portion and a second control portion, the first and second control portions being arranged in a second direction crossing a first direction, the first direction being directed from the first electrode toward the second electrode,
   the fourth insulating portion including an extending portion provided between the first control portion and the second control portion of the third electrode, the extending portion of the fourth insulating portion extending toward the second insulating portion and contacting the second insulating portion.

2. The device according to claim 1, wherein
   the fifth insulating portion extends toward the second insulating portion and has a tip positioned between the first control portion and the second control portion of the third electrode.

3. The device according to claim 2, wherein
   the fourth electrode having a thickness in the second direction between the third insulating portion and the fifth insulating portion; and
   a distance between the third electrode and the tip of the fifth insulating portion is greater than the thickness of the fourth electrode.

4. The device according to claim 2, wherein
   the third electrode further includes a middle portion provided between the first control portion and the second control portion and between the second insulating portion and the fifth insulating portion.

5. The device according to claim 1, wherein
   the first control portion of the third electrode has a first width in the second direction;
   the second control portion of the third electrode has a second width in the second direction;
   the third insulating portion has a third width from the fourth electrode to the semiconductor part; and
   the first and second widths is less than the third width in the second direction.

6. The device according to claim 4, wherein the middle portion of the third electrode contacts the fifth insulating portion.

7. The device according to claim 1, wherein
the second insulating portion is provided between the second electrode and the first control portion of the third electrode, between the second electrode and the second control portion of the third electrode, and between the second electrode and the fourth insulating portion.

8. The device according to claim 1, wherein
the third insulating portion includes silicon oxide, and
the fifth insulating portion is a silicate glass including boron and phosphorus.

9. The device according to claim 1, wherein
the semiconductor part includes a first semiconductor layer of a first conductivity type, a second semiconductor layer of a second conductivity type, and a third semiconductor layer of the first conductivity type, the first semiconductor layer extending between the first and second electrodes, the second semiconductor layer being provided between the first semiconductor layer and the second electrode, the second semiconductor layer facing the third electrode via the first insulating portion, the third semiconductor layer being selectively provided between the second semiconductor layer and the second electrode, the third semiconductor layer contacting the first insulating portion and being electrically connected to the second electrode.

* * * * *